(12) United States Patent
Terui

(10) Patent No.: US 6,472,732 B1
(45) Date of Patent: Oct. 29, 2002

(54) BGA PACKAGE AND METHOD FOR FABRICATING THE SAME

(75) Inventor: Makoto Terui, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/532,028

(22) Filed: Mar. 21, 2000

(30) Foreign Application Priority Data

Oct. 25, 1999 (JP) .......................................... 11-302497

(51) Int. Cl.[7] .............................................. H01L 23/02
(52) U.S. Cl. ...................... 257/678; 257/737; 257/787; 438/106; 438/121
(58) Field of Search ................................. 257/678, 738, 257/787, 782, 783, 784, 774, 757, 676, 686; 438/106, 121, 126, 758

(56) References Cited

U.S. PATENT DOCUMENTS

| | | | | |
|---|---|---|---|---|
| 5,239,198 A | * | 8/1993 | Lin et al. ..................... | 257/693 |
| 5,798,564 A | * | 8/1998 | Eng et al. .................... | 257/686 |
| 5,869,889 A | * | 2/1999 | Chia et al. ................... | 257/701 |
| 5,870,289 A | * | 2/1999 | Tokuda et al. ............... | 361/779 |
| 5,900,675 A | * | 5/1999 | Appelt et al. ................ | 257/778 |
| 5,977,633 A | * | 11/1999 | Suzuki et al. ................ | 257/738 |
| 6,229,215 B1 | * | 5/2001 | Egawa ......................... | 257/777 |
| 6,232,667 B1 | * | 5/2001 | Hultmark et al. ........... | 257/777 |

* cited by examiner

Primary Examiner—Elvin Enad
Assistant Examiner—Kyung S. Lee
(74) Attorney, Agent, or Firm—Rabin & Berdo

(57) ABSTRACT

A ball grid array (BGA) package includes a substrate (20) having first and second surfaces. and through holes (30) passing through it. The package further includes a first semiconductor chip (28) which is mounted on the first surface of the substrate (20); a second semiconductor chip (36) which is mounted on the second surface of the substrate (20); and solder balls (34) which are provided on the first surface of the substrate (20) and are electrically connected to the first semiconductor chip (28). The second semiconductor chip (36) is electrically connected via the through holes (30) to the solder balls (34).

17 Claims, 17 Drawing Sheets

US 6,472,732 B1

BGA PACKAGE AND METHOD FOR FABRICATING THE SAME

CROSS REFERENCE TO RELATED APPLICATION

This application claims the priority of Application No. H11-302497, filed Oct. 25, 1999 in Japan, the subject matter of which is incorporated herein by reference.

TECHNICAL FIELD OF THE INVENTION

The present invention relates to a BGA (Ball Grid Array) package, and a method for fabricating the same.

BACKGROUND OF THE INVENTION

A conventional BGA package includes a substrate having a copper plate. an insulating layer and a copper wiring pattern. The BGA package is designed to have a good characteristic of heat radiation. The insulating layer may be of polyimide, which is formed on the copper plate. The copper wiring pattern is formed on the insulating layer. The substrate is provided with solder balls to be connected to a motherboard. A semiconductor chip is connected at electrodes to the copper wiring pattern by bonding wires.

According to the above described conventional BGA package, when a large number of solder balls are used or the solder balls are arranged with a smaller pitch, some of the solder balls are not used for operation. In other words, a large number of excess or redundant terminals are made. Such excess terminals are not electrically connected to the semiconductor chip. Further, when the conventional BGA package with a large number of solder balls is mounted on a motherboard, the BGA package occupies a larger area on the motherboard. As a result, the motherboard would be larger in size.

OBJECTS OF THE INVENTION

Accordingly, an object of the present invention is to provide a ball grid array (BGA) package in which solder balls are used efficiently without making a large number of excess terminals (solder balls). This feature allows that a BGA package can be fabricated small in size with higher integration.

Another object of the present invention is to provide a method for fabricating a ball grid array (BGA) package in which solder balls are used efficiently without making a large number of excess terminals (solder balls). This feature allows that a BGA package can be fabricated small in size with higher integration.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the present invention, a ball grid array (BGA) package includes a substrate (20) having first and second surfaces, and through holes (30) passing through it. The package further includes a first semiconductor chip (28) which is mounted on the first surface of the substrate (20); a second semiconductor chip (36) which is mounted on the second surface of the substrate (20); and solder balls (34) which are provided on the first surface of the substrate (20) and are electrically connected to the first semiconductor chip (28). The second semiconductor chip (36) is electrically connected via the through holes (30) to the solder balls (34).

According to a second aspect of the present invention, a method includes the steps of providing a substrate (20) having first and second surfaces, and through holes (30) passing through it; mounting a first semiconductor chip (28) on the first surface of the substrate (20); and mounting a second semiconductor chip (36) on the second surface of the substrate (20). The method further includes the step of providing solder balls (34) on the first surface of the substrate (20) so that the solder balls (34) are electrically connected to the first semiconductor chip (28) and to the second semiconductor chip (36) via the through holes (30).

DETAILED DISCLOSURE OF THE INVENTION

Figure 1:
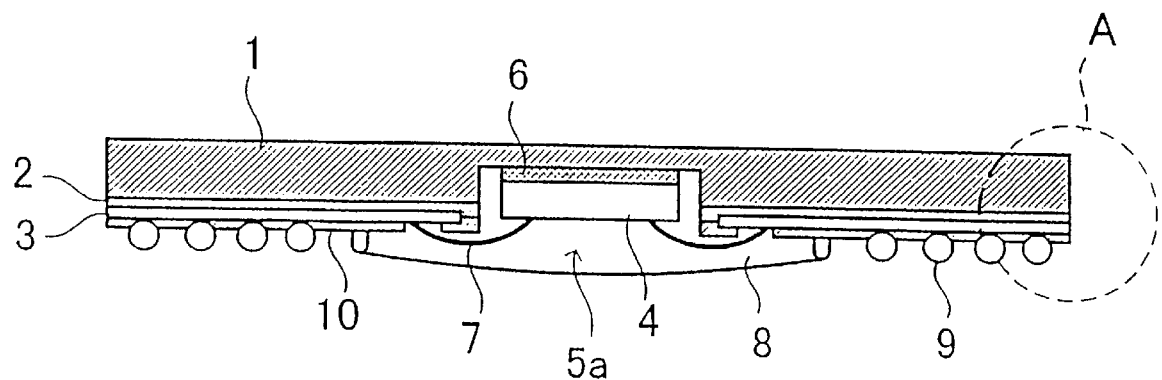
FIG. 1 is a cross-sectional view showing a conventional BGA package.
Figure 2:
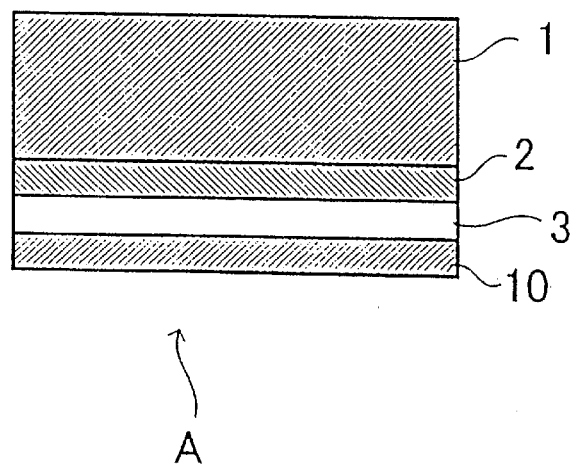
FIG. 2 is an enlarged cross-sectional view showing the detail of a part encircled by "A" in FIG. 1.

For better understanding of the present invention, a conventional technology is first described. FIG. 1 shows a conventional BGA package, and FIG. 2 shows a part encircled by a broken line "A" in FIG. 1. The BGA package includes a copper plate 1, an insulating layer 2 and a copper wiring pattern 3. The BGA package is designed to have a good characteristic of heat radiation. The copper plate 1 is shaped to have a thickness of 0.3 to 0.4 mm. The insulating layer 2 may be of polyimide having a thickness of 10 to 30 $\mu$m, which is adhered onto the copper plate 1. The copper wiring pattern 3 is shaped to have a thickness of 12 to 35 $\mu$m and is formed on the insulating layer 2. The copper plate 1 is cut off to provide a cavity 5a in which a semiconductor chip 4 is placed.

The semiconductor chip 4 has electrode side surface (front surface) and rear surface. The semiconductor chip 4 is fixed at the rear surface to the bottom of the cavity 5a with an insulating paste 6. The semiconductor chip 4 is connected at electrodes to the copper wiring pattern 3 by bonding wires 7. The cavity 5a is to be filled up with an epoxy resin 8. The substrate structure is provided at regions uncovered with the epoxy resin 8 with solder balls 9, which are arranged in lattice manner. The other regions of the substrate structure is covered with a resist layer 10.

Figure 3:
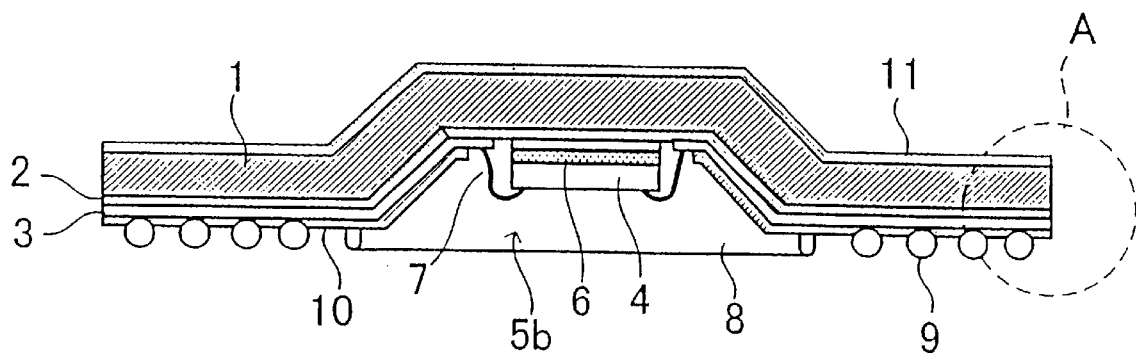
FIG. 3 is a cross-sectional view showing another conventional BGA package.
Figure 4:
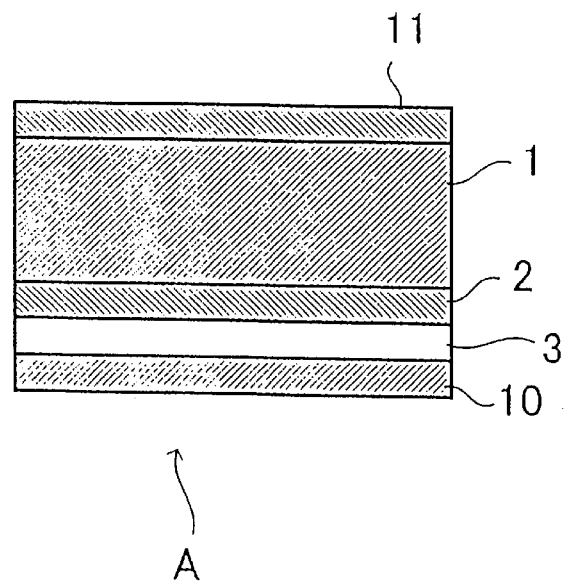
FIG. 4 is an enlarged cross-sectional view showing the detail of a part encircled by "A" in FIG. 3.
Figure 5:
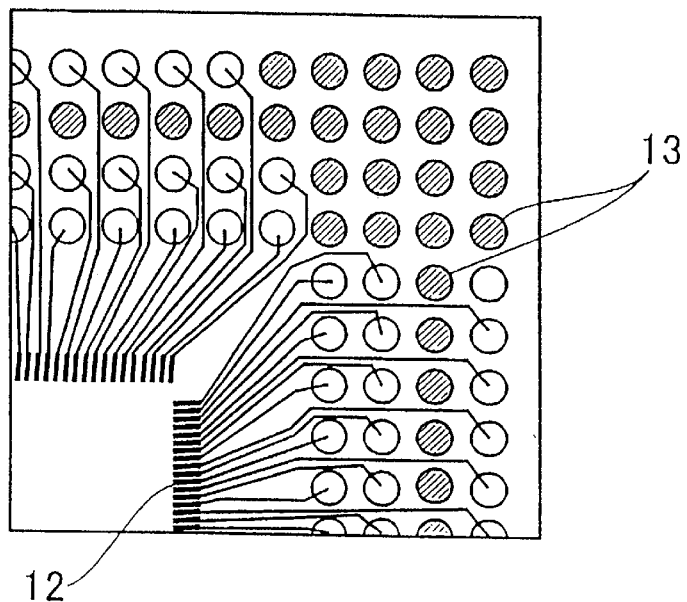
FIGS. 5 and 6 are drawings used for explaining disadvantages of the conventional BGA packages, shown in FIGS. 1 and 3.

FIG. 3 shows another conventional BGA package, and FIG. 4 shows a part encircled by a broken line "A" in FIG. 3. In FIGS. 3 and 4, the same or corresponding elements to those in FIGS. 1 and 2 are represented by the same reference numerals; and the same description is not repeated for avoiding redundant explanation. The BGA package includes a copper plate 1, an insulating layer 2 and a copper wiring pattern 3. A metal mold reduction (drawing) process is carried out to the copper plate 1 to form a cavity 5b in which a semiconductor chip 4 is placed. The copper plate 1 may be provided at the rear surface with another insulating layer 11 to reduce the degree of bending of the structure and to prevent contamination.

Figure 6:
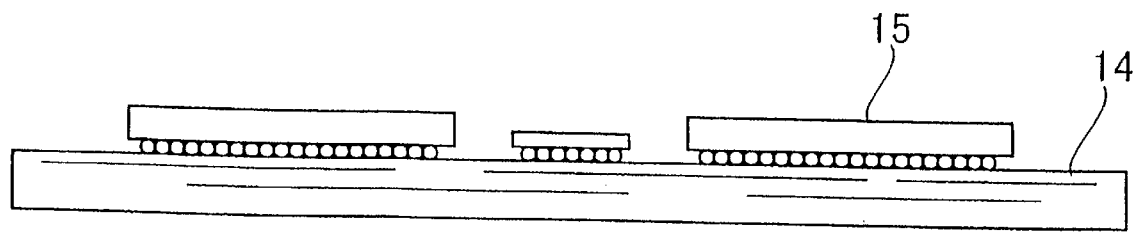

According to the above described conventional BGA packages, when a large number of solder balls are used or the solder balls 9 are arranged with a smaller pitch, some of the solder balls 9 are not used for operation. In other words, a large number of excess or redundant terminals 13 are made. Such excess terminals 13 are not connected to any of bonding posts 12, which are connected to the electrodes of the semiconductor chip 4 by the bonding wires 7. Further, when the conventional BGA packages (15) with a large number of solder balls are mounted on a motherboard 14, as shown in FIG. 6, the BGA package 15 occupies a larger area on the motherboard 14. As a result. the motherboard would be larger in size.

Figure 7:
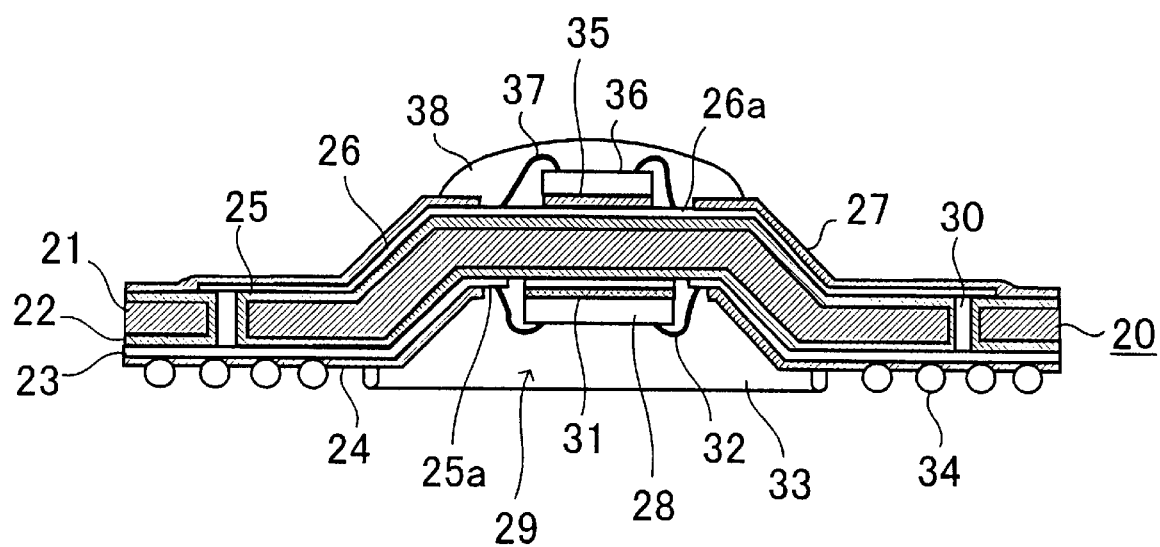
FIG. 7 is a cross-sectional view showing a BGA package according to a first preferred embodiment of the present invention.
Figure 8:
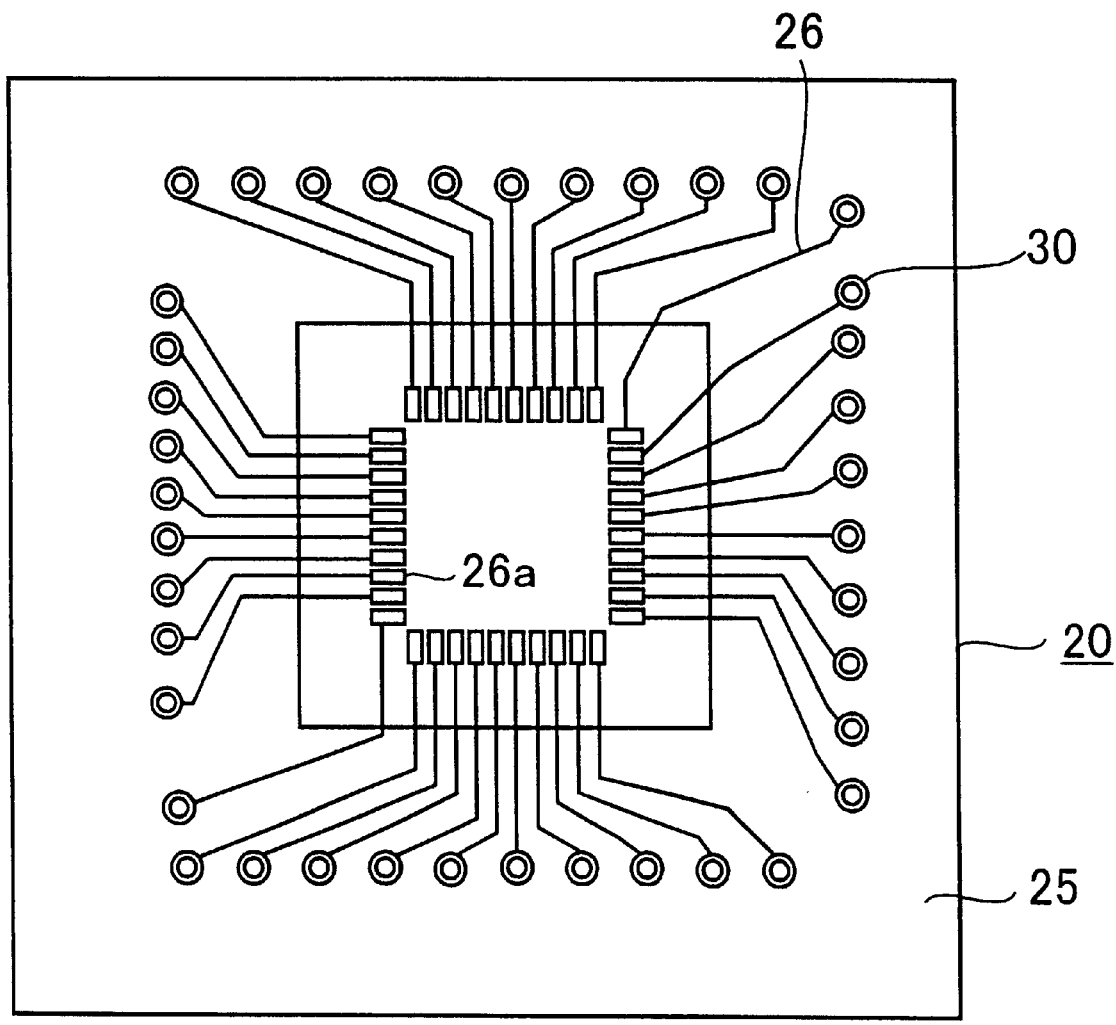
FIG. 8 is a plan view showing a substrate used in the BGA package, shown in FIG. 7.
Figure 9:
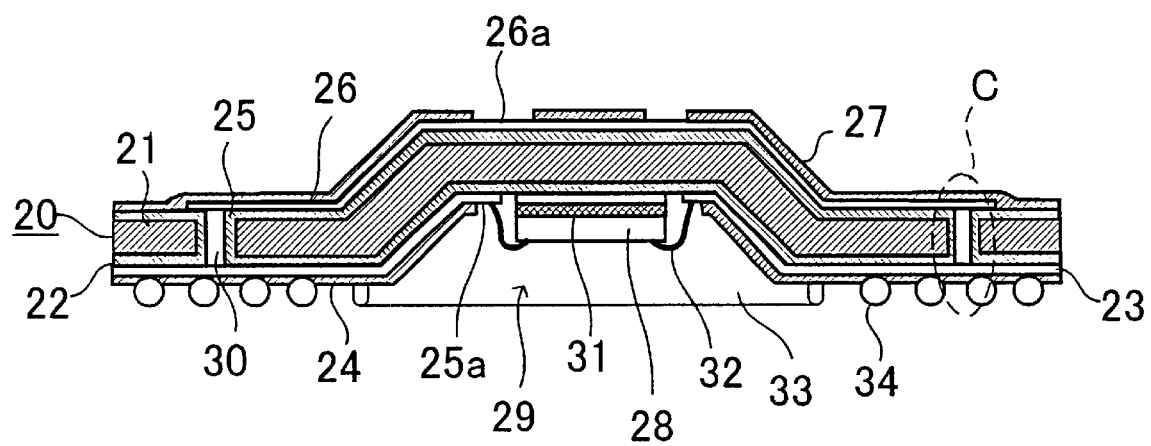
FIG. 9 is a cross-sectional view showing the substrate used in the BGA package, shown in FIG. 7.
Figure 10:
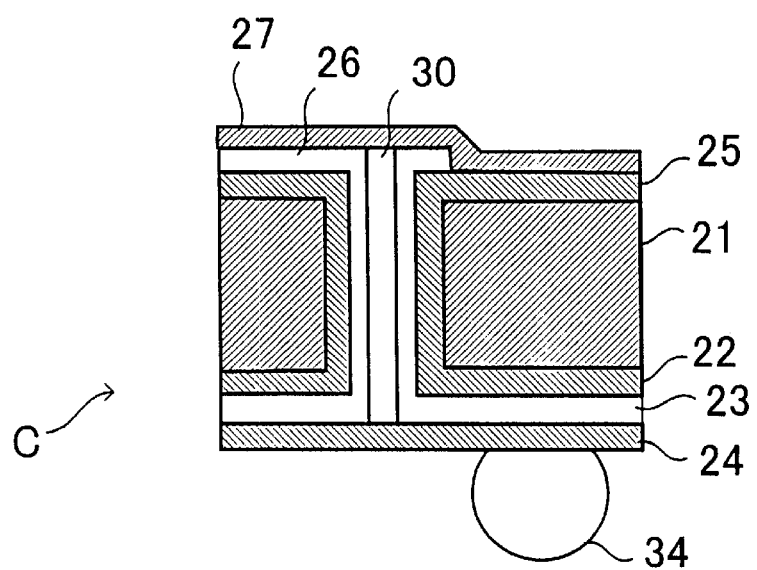
FIG. 10 is an enlarged cross-sectional view showing the detail of a part encircled by "C" in FIG. 9.

FIG. 7 shows a BGA package according to a first preferred embodiment of the present invention. FIGS. 8 to 10 show a substrate (20) used for fabricating the BGA package, shown in FIG. 7. In FIGS. 7 to 10, the same or corresponding elements are represented by the same reference numerals. The BGA package includes a substrate 20, which includes a copper plate 21 shaped to have a thickness of 0.3 to 0.4 mm. The copper plate 21 is provided on a front surface with an insulating layer 22 of polyimide having a thickness of 10 to 30 $\mu$m. A copper wiring pattern 23 is formed on the insulating layer 22. A solder resist 24 is formed (spread) over the copper wiring pattern 23 except some areas thereon.

The copper plate 21 is provided on a rear surface with another insulating layer 25 of polyimide having a thickness of 10 to 30 $\mu$m. Another copper wiring pattern 26 is formed on the insulating layer 25 to have a thickness of 12 to 35 $\mu$m. Another solder resist 27 is formed (spread) over the copper wiring pattern 26 except some areas thereon. The substrate 20 includes the copper plate 21, insulating layers 22 and 25, copper wiring patterns 23 and 26.

A metal mold reduction (drawing) process is carried out to the substrate 20 to form a cavity 29 at the front surface in which a semiconductor chip 28 is placed. The copper plate 21 is provided therein with through holes 30, which connect the front surface and rear surface thereof. The through holes 30 are insulated from the copper plate 21. One ends of the copper wiring patterns 23 and 26 form bonding posts 25a and 26a, which are to be connected to bonding wires 32 and 37. The other ends of the copper wiring pattern 26 are-connected to the through holes 30.

In the cavity 29, an insulating paste 31 is formed (spread) over so that the semiconductor chip 28 is well fixed at the rear surface in the cavity 29. The semiconductor chip 28 is provided at the rear surface with no electrodes. The semiconductor chip 28 is connected at the electrodes to the copper wiring pattern 23 by the bonding wires 32. The cavity 29 is to be filled up with an epoxy resin 33. The substrate 20 is provided at the front surface with solder balls 34, which are arranged in lattice manner. The solder balls 34 are arranged at exposed regions of the solder resist 27. Each of the through holes 30 is connected to the solder balls 34.

Another insulating paste 35 is formed (spread) over a part of the rear surface of the substrate 20 so that another semiconductor chip 36 is mounted on the substrate 20. The semiconductor chip 36 is connected at electrodes to the bonding posts 26a of the copper wiring pattern 26 by the bonding wires 37. The semiconductor chip 36 is sealed with an epoxy resin 38 in the same manner as the semiconductor chip 28.

In the BGA package, shown in FIG. 7, electrical signals are transferred to/from the semiconductor chip 28 through the solder balls 34 and copper wiring pattern 23. Further, electrical signals are transferred to/from the other semiconductor chip 36 through the solder balls 34, through holes 30 and copper wiring pattern 26.

As described above, according to the first preferred embodiment of the present invention, the copper wiring patterns 23 and 26 are formed both on the front and rear surfaces of the copper plate 21; and the semiconductor chip 36 mounted on the rear surface of the base plate 21 is connected at its electrodes to the solder balls 34 arranged on the front surface of the base plate (21) via the through holes 30. Therefore, the excess terminals, which are the solder balls 34 not connected to the semiconductor chip 28, can be used as terminals to be connected to the other semiconductor chip 36. In addition, according to the first preferred embodiment, the semiconductor chips 28 and 36 are mounted on the both surface of the substrate, so that only a small area is need to mount two semiconductor chips on a motherboard. It means that the motherboard can be designed smaller in size.

Figure 11:
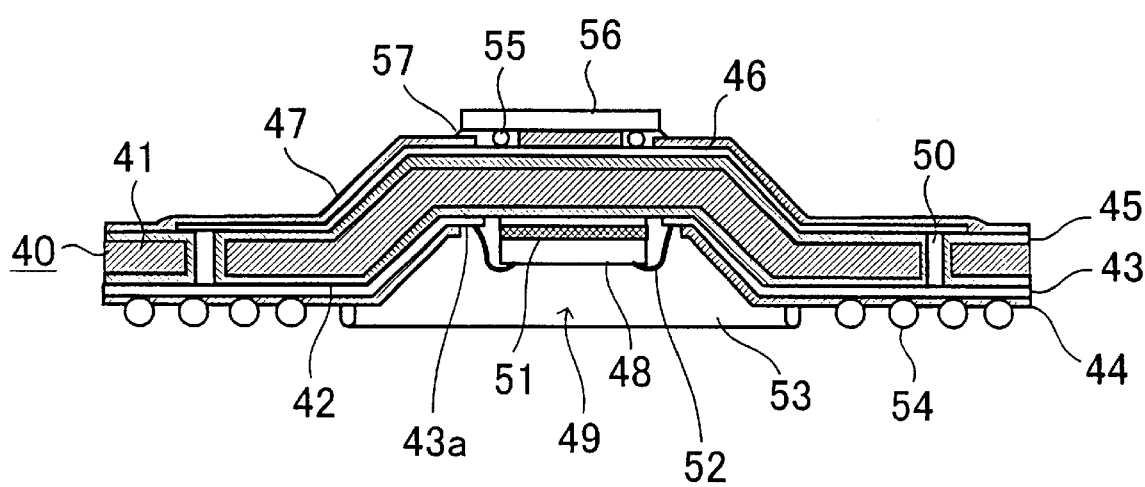
FIG. 11 is a cross-sectional view showing a BGA package according to a second preferred embodiment of the present invention.
Figure 12:
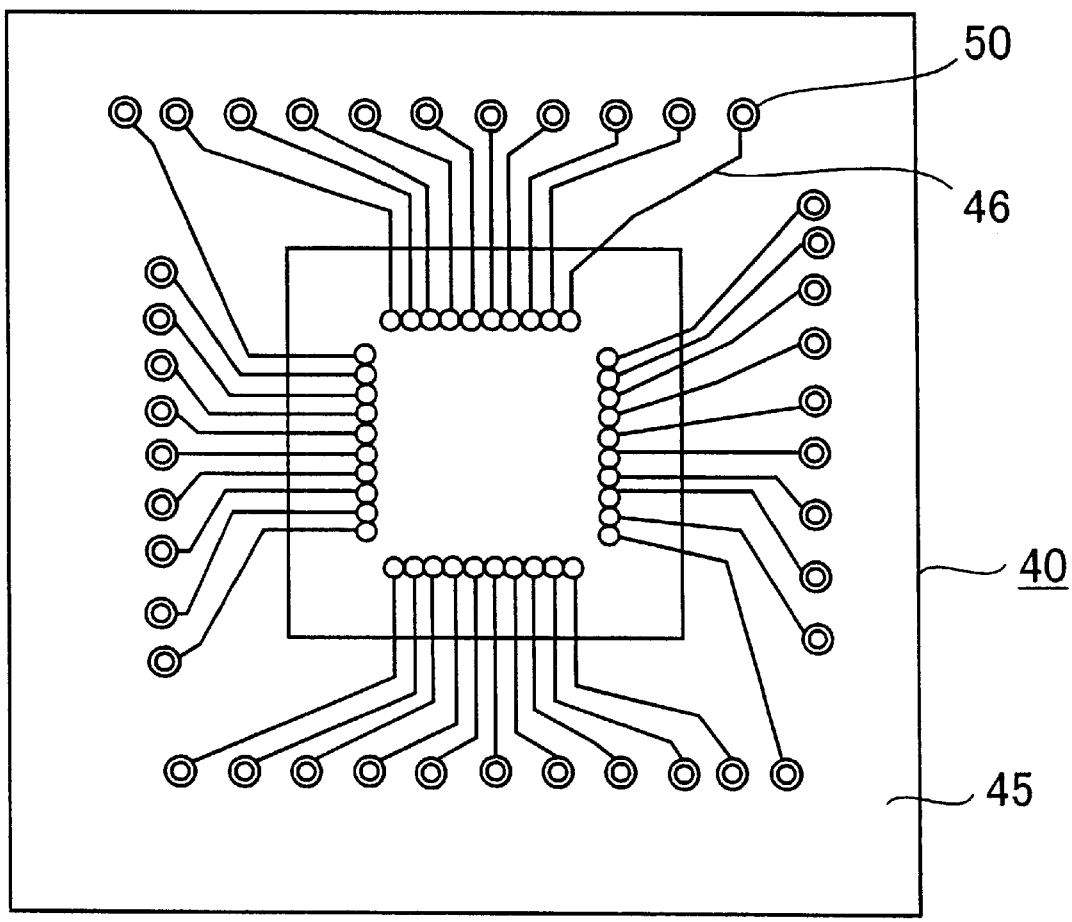
FIG. 12 is a plan view showing a substrate used in the BGA package, shown in FIG. 11.
Figure 13:
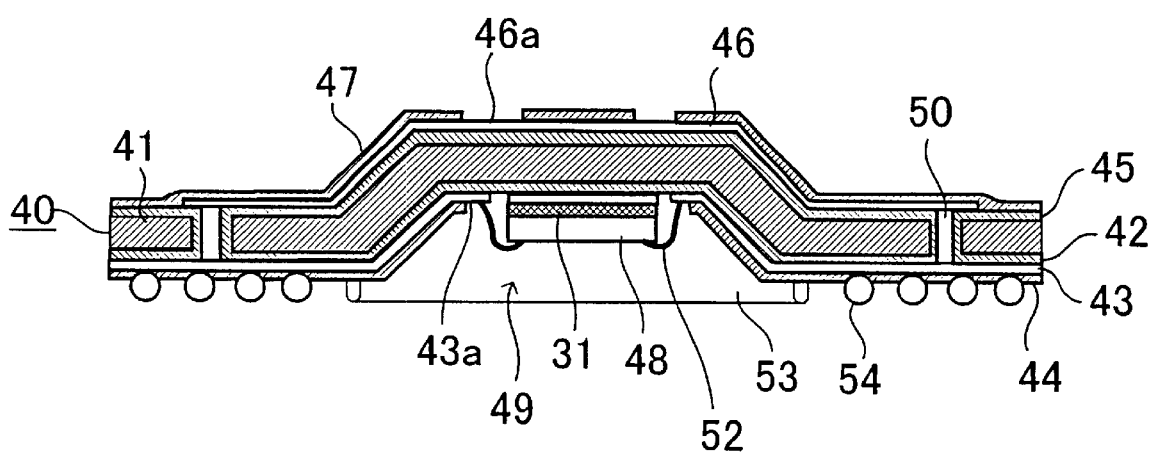
FIG. 13 is a cross-sectional view showing the substrate used in the BGA package, shown in FIG. 11.

FIG. 11 shows a BGA package according to a second preferred embodiment of the present invention. FIGS. 12 and 13 show a substrate (40) used for fabricating the BGA package, shown in FIG. 11. In FIGS. 11 to 13, the same or corresponding elements are represented by the same reference numerals. The BGA package includes a substrate 40. which includes a copper plate 41. The copper plate 41 is provided on a front surface with an insulating layer 42 of polyimide having a thickness of 10 to 30 $\mu$m. A copper wiring pattern 43 is formed on the insulating layer 42. A solder resist 44 is formed (spread) over the copper wiring pattern 43 except some areas thereon.

The copper plate 41 is provided on a rear surface with another insulating layer 45 of polyimide having a thickness of 10 to 30 μm. Another copper wiring pattern 46 is formed on the insulating layer 45 to have a thickness of 12 to 35 μm. Another solder resist 47 is formed (spread) over the copper wiring pattern 46 except some areas thereon. The substrate 40 includes at least the copper plate 41, insulating layers 42 and 45, and copper wiring patterns 43 and 46.

A metal mold reduction (drawing) process is carried out to the substrate 40 to form a cavity 49 at the front surface in which a semiconductor chip 48 is placed. The copper plate 41 is provided therein with through holes 50, which connect the front surface and rear surface thereof. The through holes 50 are insulated from the copper plate 41. One ends of the copper wiring pattern 43 form bonding posts 43a, which are to be connected to bonding wires 52. One ends of the copper wiring pattern 46 form lands 46a, which are to be connected to gold bumps 55. The lands 46a are formed by steps of plating Ni as a base and plating gold thereon.

The other ends of the copper wiring pattern 46 are connected to the through holes 50. In the cavity 49, an insulating paste 51 is formed (spread) over so that the semiconductor chip 48 is well fixed at the rear surface in the cavity 49. The semiconductor chip 48 is provided at the rear surface with no electrodes. The semiconductor chip 48 is connected at the electrodes to the copper wiring pattern 43 by the bonding wires 52. The cavity 49 is to be filled up with an epoxy resin 53. The substrate 40 is provided at the front surface with solder balls 54. which are arranged in lattice manner. The solder balls 54 are arranged at exposed regions of the solder resist 47. Each of the through holes 50 is connected to the solder balls 54. Another semiconductor chip 56 is mounted on the rear surface of the substrate 40 so that an electrode side surface of the semiconductor chip 56 opposes to the rear surface of the substrate 40. The semiconductor chip 56 is provided at the electrode side surface with the gold bumps 55 so that the electrodes of the semiconductor chip 56 are electrically connected to the copper wiring pattern 46 through the gold bumps 56. A space formed between the rear surface of the substrate 40 and electrode side surface of the semiconductor chip 56 is filled up with a seal resin 57.

Figure 14A:
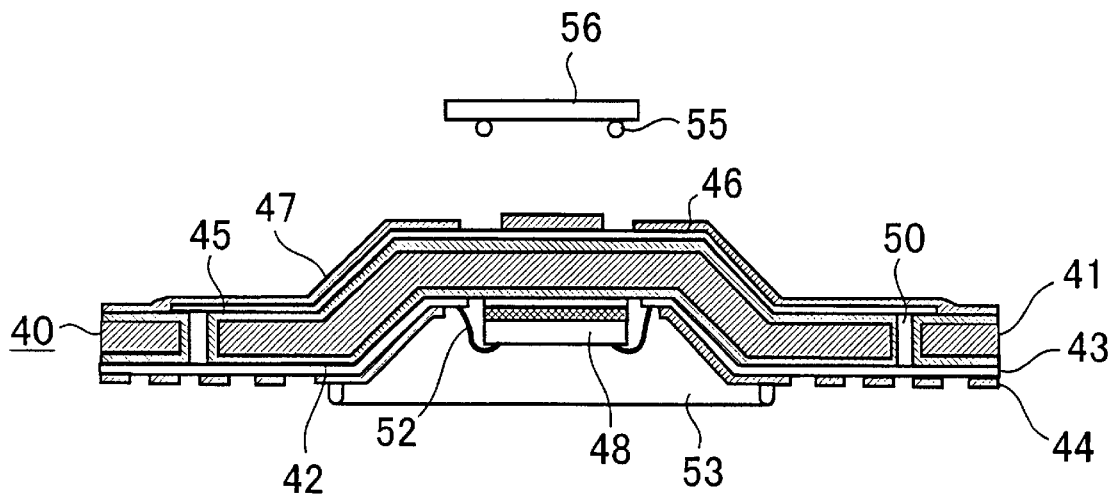
FIGS. 14A to 14D are cross-sectional views showing the fabrication steps of the BGA package, shown in FIG. 11.

FIGS. 14A to 14D are cross-sectional views showing the fabrication steps of the BGA package, shown in FIG. 11. First, as shown in FIG. 14A. the through holes 50 are patterned in the copper plate 41; then the insulating layer 42 is adhered onto the front surface of the copper plate 41; and the copper wiring pattern 43 is formed on the insulating layer 42. The insulating layer 45 is adhered onto the rear surface of the copper plate 41, and the copper wiring pattern 46 is formed on the insulating layer 45. Next, the solder resists 44 and 47 are provided on the copper wiring patterns 43 and 46, respectively, and then the semiconductor chip 48 is mounted in the cavity 49. After that, the semiconductor chip 48 is connected at the electrodes to the copper wiring pattern 43 by the bonding wires 52. Subsequently, the semiconductor chip 48 is sealed with the epoxy resin 53. The gold bumps 55 are arranged on the electrodes of the semiconductor chip 56 so that the bumps 55 are projecting outwardly.

Figure 14B:
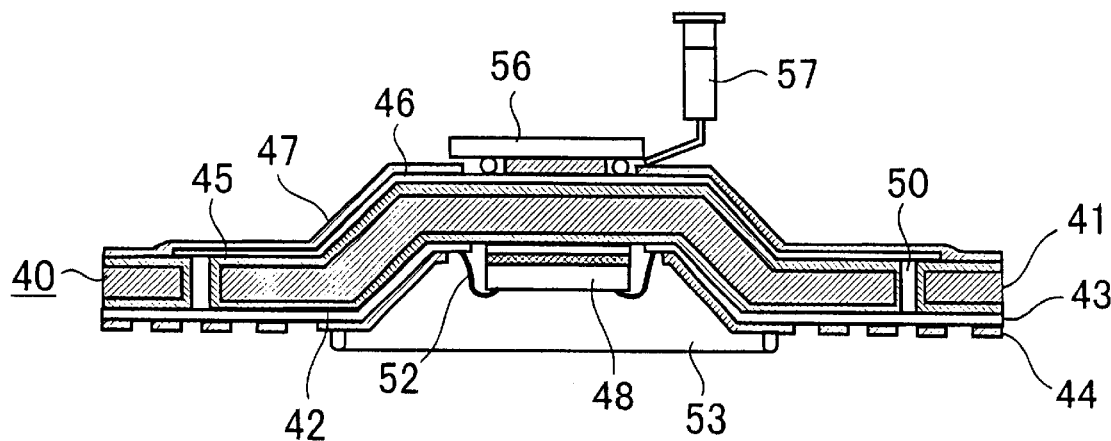

Next, as shown in FIG. 14B, the semiconductor chip 56 is positioned so that the electrode side surface thereof opposes to the rear surface of the substrate 40, and then the gold bumps 55 are in contact with the lands 46a of the substrate 40. After that, the resin 57 is injected sidewardly into the space between the semiconductor chip 56 and the substrate 40.

Figure 14C:
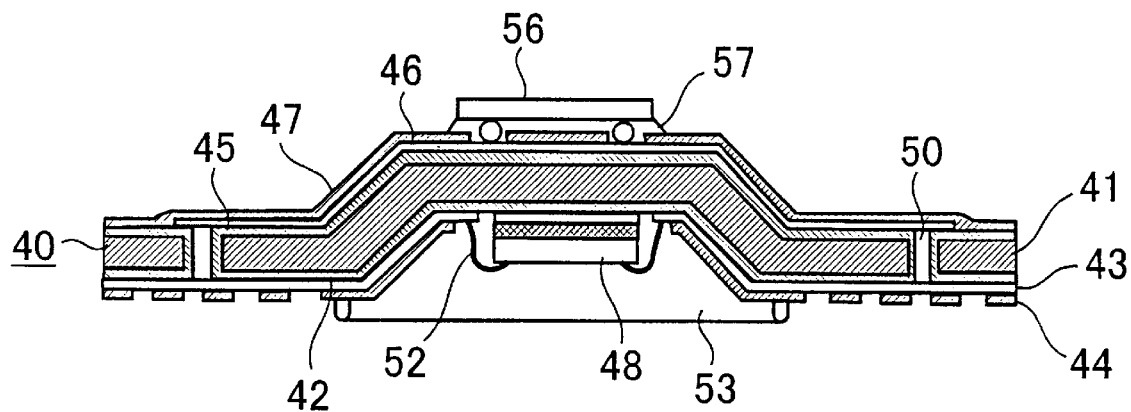
Figure 14D:
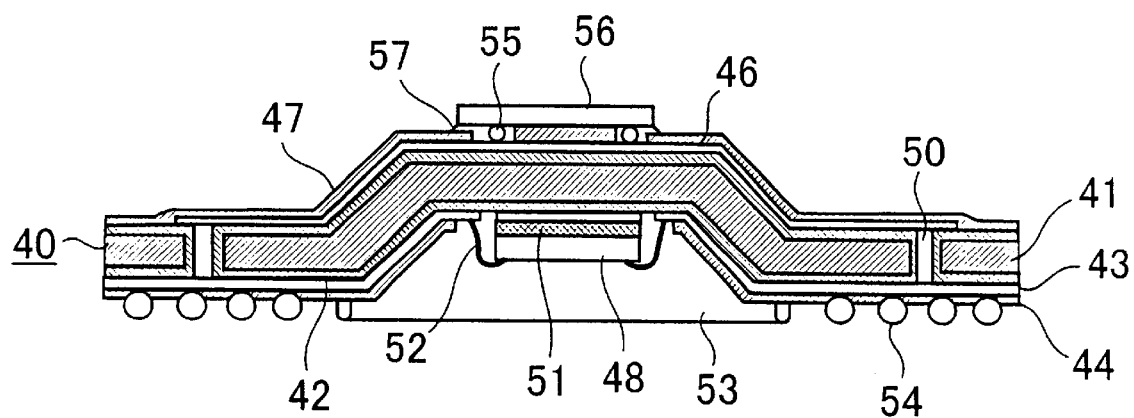

Subsequently, as shown in FIG. 14C, the resin 57 is hardened with heat to seal the semiconductor chip 56 therein. Next, as shown in FIG. 14D, the solder balls 64 are provided onto the front surface of the substrate 40.

In the BGA package, shown in FIG. 11, electrical signals are transferred to/from the semiconductor chip 48 through the solder balls 54 and copper wiring pattern 43. Further, electrical signals are transferred to/from the other semiconductor chip 54 through the solder balls 54, through holes 50 and copper wiring pattern 46.

As described above, according to the second preferred embodiment of the present invention. the excess terminals, which are the solder balls 54 not connected to the semiconductor chip 48, can be used as terminals to be connected to the other semiconductor chip 56. in the same manner as the first preferred embodiment. In addition, the semiconductor chips 48 and 56 are mounted on the both surface of the substrate 40, so that only a small area is needed to mount two semiconductor chips on a motherboard. It means that the motherboard can be designed smaller in size.

Further, the semiconductor chip 66 is mounted on the substrate 40 using the gold bumps 56, so that the BGA package can be fabricated in a shorter period of time as compared to the first preferred embodiment.

FIGS. 15A to 15E are cross-sectional views showing the fabrication steps of a BGA package, according to a third preferred embodiment of the present invention. In this embodiment, the same or corresponding elements to those in the second preferred embodiment are represented by the same reference numerals and the same description is not repeated for avoiding redundant explanation.

Figure 15A:
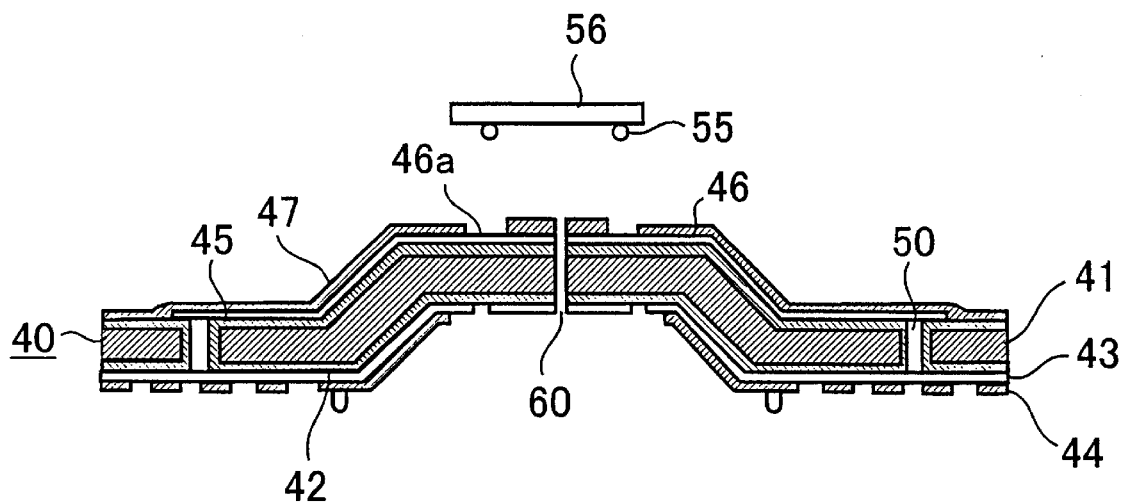
FIGS. 15A to 15E are cross-sectional views showing the fabrication steps of a BGA package according to a third preferred embodiment of the present invention.

First, as shown in FIG. 15A, a patterning process is carried out to form an insulating layer 42 on a front surface of a copper plate 41, and then a copper wiring pattern 43 is formed on the insulating layer 42. Another insulating layer 45 is formed on the rear surface of the copper plate 41, and then another copper wiring pattern 46 is formed on the insulating layer 45. After that, through holes 50 are formed in the copper plate 41. Subsequently, solder resists 44 and 47 are formed on the copper wiring patterns 43 and 46. Next, a hole 60 is formed in the substrate 40 at the center of a region where a semiconductor chip 56 is to be mounted. The hole 60 passes through the substrate 40. Gold bumps 55 are arranged on electrodes of the semiconductor chip 56 so that the bumps 55 are projecting outwardly.

Figure 15B:
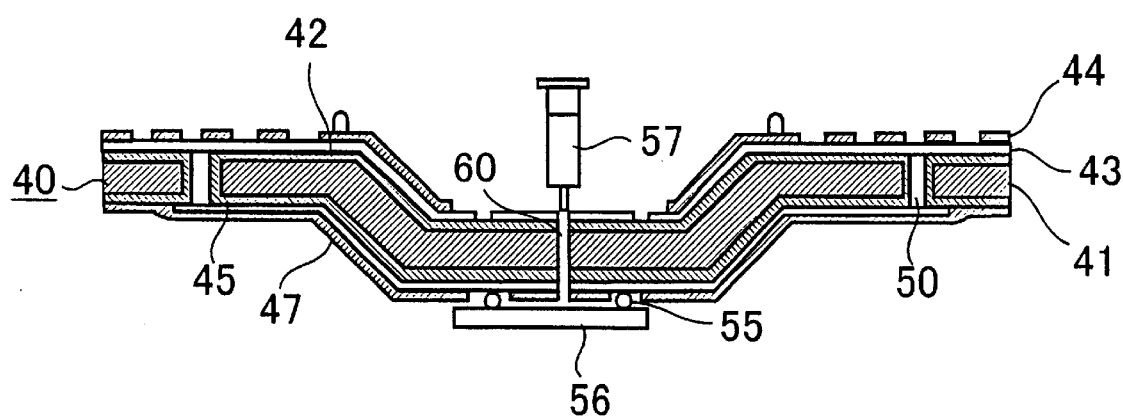
Figure 15C:
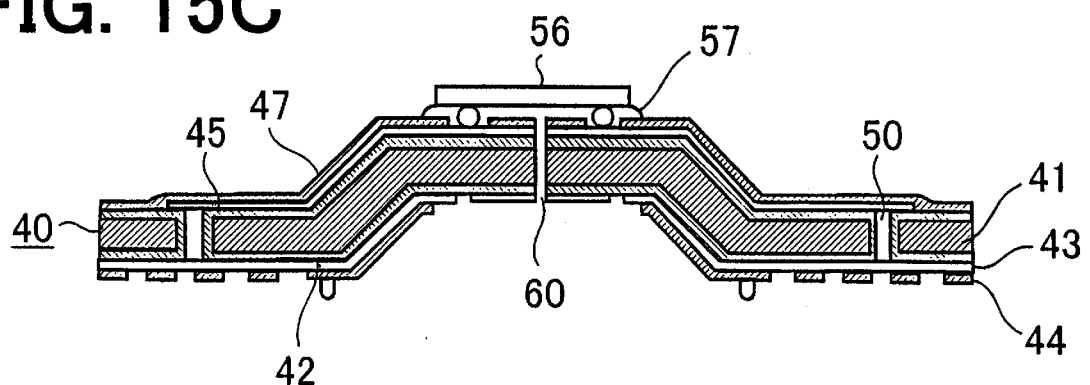

Next, as shown in FIG. 15B. the semiconductor chip 56 is positioned so that the electrode side surface opposes to the rear surface of the substrate 40, and then the gold bumps 55 are in contact with the lands 46a of the substrate 40. The gold bumps 55 are heated and pressed to the lands 46a so that those are connected to each other. After that, resin 57 is injected into the space between the semiconductor chip 56 and the substrate 40 through the hole 60. Subsequently, as shown in FIG. 15C, the resin 57 is hardened with heat to seal the semiconductor chip 56 therein.

Figure 15D:
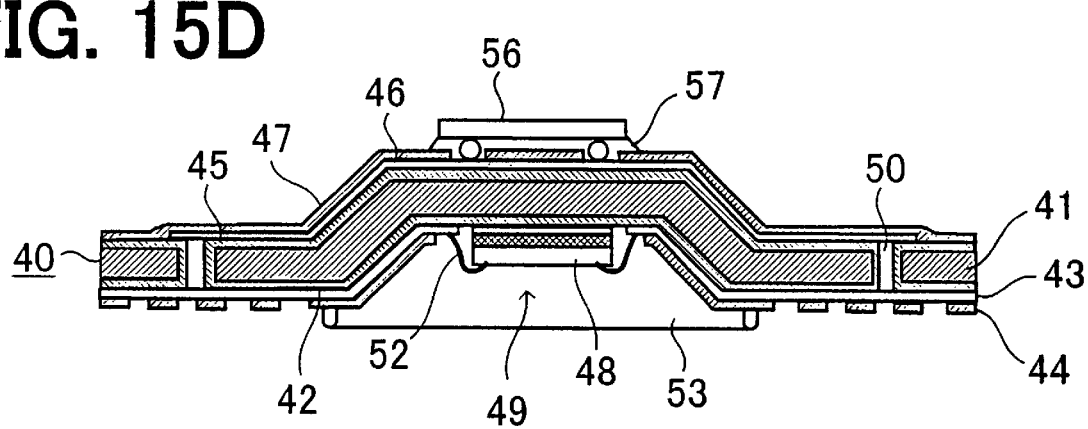
Figure 15E:
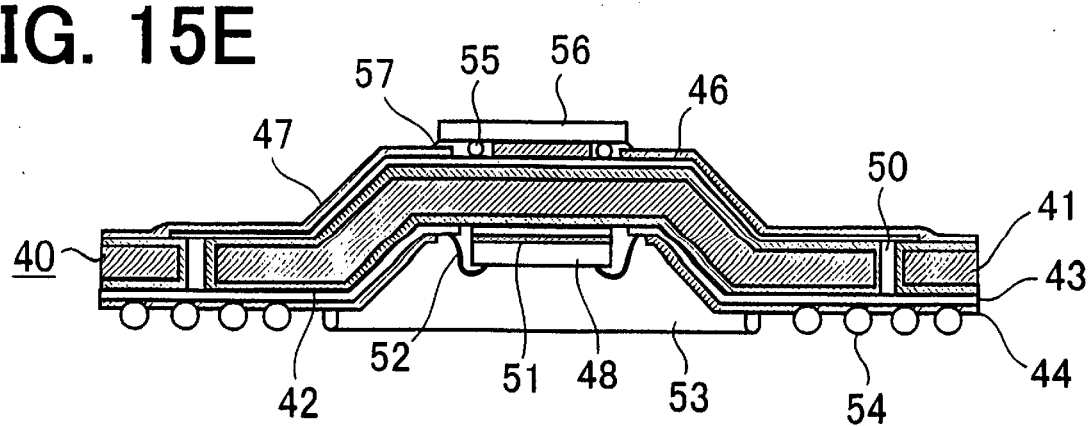

Next, as shown in FIG. 15D, the semiconductor chip 48 is mounted onto the cavity 49, and then the electrodes thereof are connected to the copper wiring pattern 43 by the bonding wires 52. Next, the electrode side surface of the semiconductor chip 48 is sealed with an epoxy resin 53. Next, as shown in FIG. 15E, the solder balls 64 are provided onto the front surface of the substrate 40.

According to the third preferred embodiment of the present invention, as well as the first and second preferred embodiments, the excess terminals, which are the solder balls 54 not connected to the semiconductor chip 48. can be used as terminals to be connected to the other semiconductor chip 56. In addition, the semiconductor chips 48 and 56 are mounted on the both surface of the substrate 40, so that only a small area is needed to mount two semiconductor chips on a motherboard. It means that the motherboard can be designed smaller in size.

Further, the semiconductor chip 56 is mounted on the substrate 40 using the gold bumps 56, so that the BGA package can be fabricated in a shorter period of time as compared to the first preferred embodiment. Further more, the resin 57 is supplied through the hole 60, passing through the substrate 40, the resin 57 can be spread uniformly. As a result, the resin 57 keeps its original shape even after the package is completed; and the semiconductor chip 56 may keep its reliability of connection (operation) high.

Figure 16A:
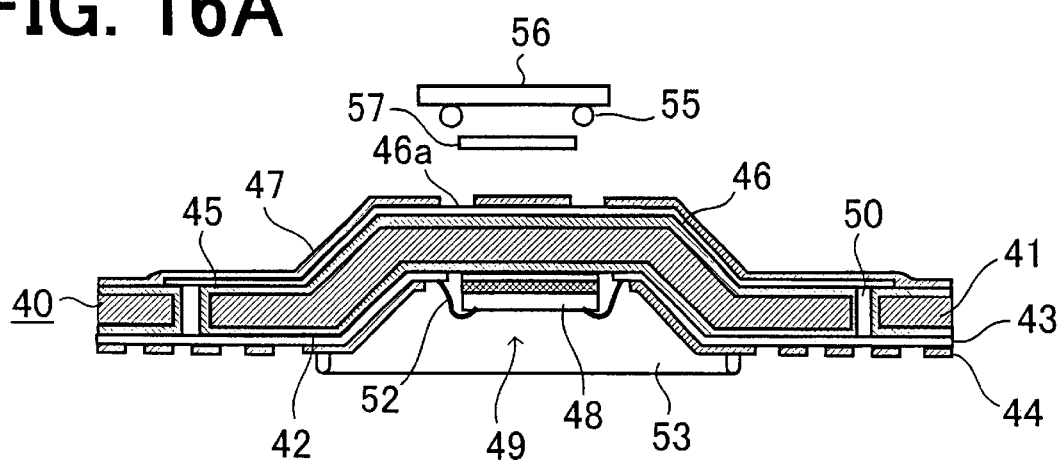
FIGS. 16A to 16C are cross-sectional views showing the fabrication steps of a BGA package according to a fourth preferred embodiment of the present invention.
Figure 16B:
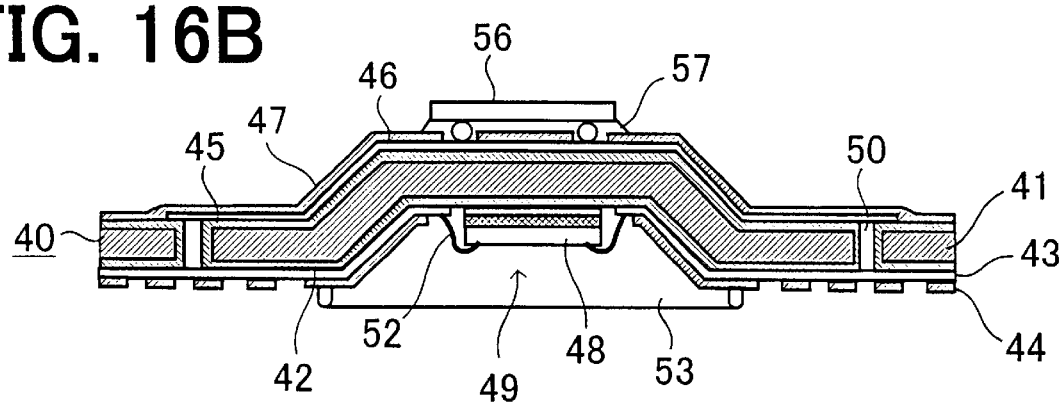
Figure 16C:
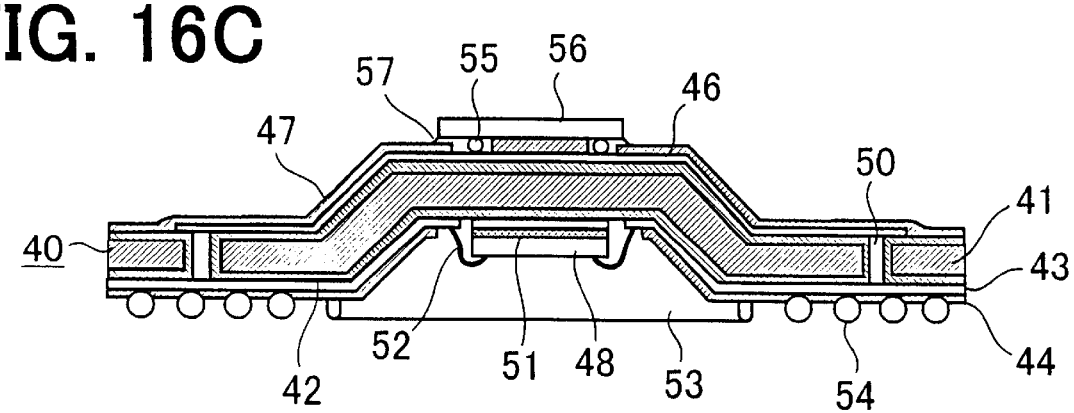

FIGS. 16A to 16C are cross-sectional views showing the fabrication steps of a BGA package, according to a fourth preferred embodiment of the present invention. In this embodiment, the same or corresponding elements to those in the second and third preferred embodiments are represented by the same reference numerals and the same description is not repeated for avoiding redundant explanation.

First, as shown in FIG. 16A, a patterning process is carried out to a copper plate 41 to form an insulating layer 42 on a front surface of the copper plate 41, and then a copper wiring pattern 43 is formed on the insulating layer 42. Another insulating layer 45 is formed on the rear surface of the copper plate 41, and then another copper wiring pattern 46 is formed on the insulating layer 45. After that, through holes 50 are formed in the copper plate 41. Subsequently, solder resists 44 and 47 are formed on the copper wiring patterns 43 and 46. A semiconductor chip 48 is placed and fixed in a cavity 49. and then the semiconductor chip 48 is connected at electrodes to the copper wiring pattern 43 by bonding wires 52. The semiconductor chip 48 is sealed at the electrode surface with an epoxy resin 53. On the other hand, gold bumps 55 are arranged on the electrodes of another semiconductor chip 56 so that the bumps 55 are projecting outwardly.

Next. a tape-shaped resin 57 is placed on a region of the substrate 40 on which the semiconductor chip 56 is mounted, and then the semiconductor chip 56 is mounted on the substrate 40 with the resin 57. In this step, the gold bumps 55 are in touch with lands 46a of the copper wiring pattern 46, and those are heated and pressed to each other for connection. At the same time, the resin 57 is heated for setting to seal the electrode side surface of the semiconductor chip 56. as shown in FIG. 16B.

Next, as shown in FIG. 16C, solder balls 64 are provided onto the front surface of the substrate 40.

According to the fourth preferred embodiment of the present invention, as well as the first to third preferred embodiments, the excess terminals. which are the solder balls 54 not connected to the semiconductor chip 48, can be used as terminals to be connected to the other semiconductor chip 56. In addition. the semiconductor chips 48 and 56 are mounted on the both surface of the substrate 40, so that only a small area is needed to mount two semiconductor chips on the motherboard. It means that the motherboard can be designed smaller in size.

Further, the semiconductor chip 56 is mounted on the substrate 40 using the gold bumps 56, so that the BGA package can be fabricated in a shorter period of time as compared to the first preferred embodiment. Further more, the semiconductor chip 56 can be sealed at the same time when the bump 55 are connected, so that the sealing process of the chip 56 can be carried out for a shorter period of time as compared to the second and third preferred embodiments.

Figure 17:
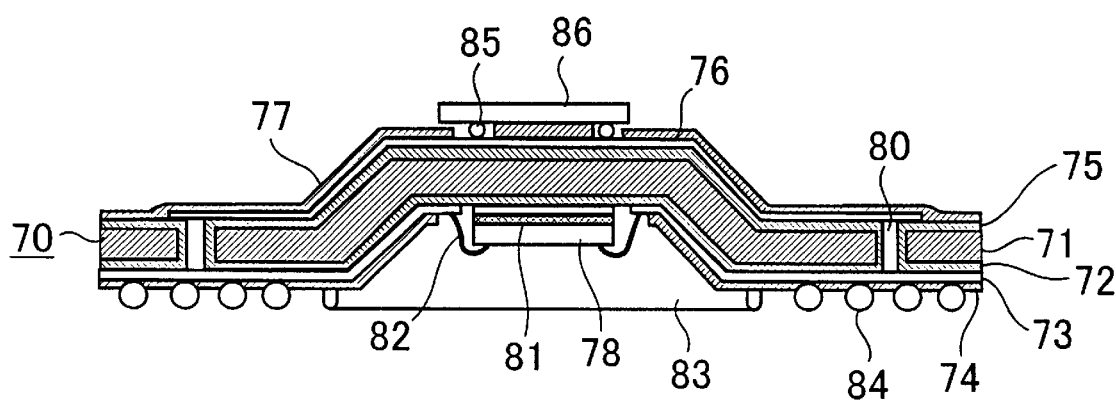
FIG. 17 is a cross-sectional view showing a BGA package according to a fifth preferred embodiment of the present invention.
Figure 18:
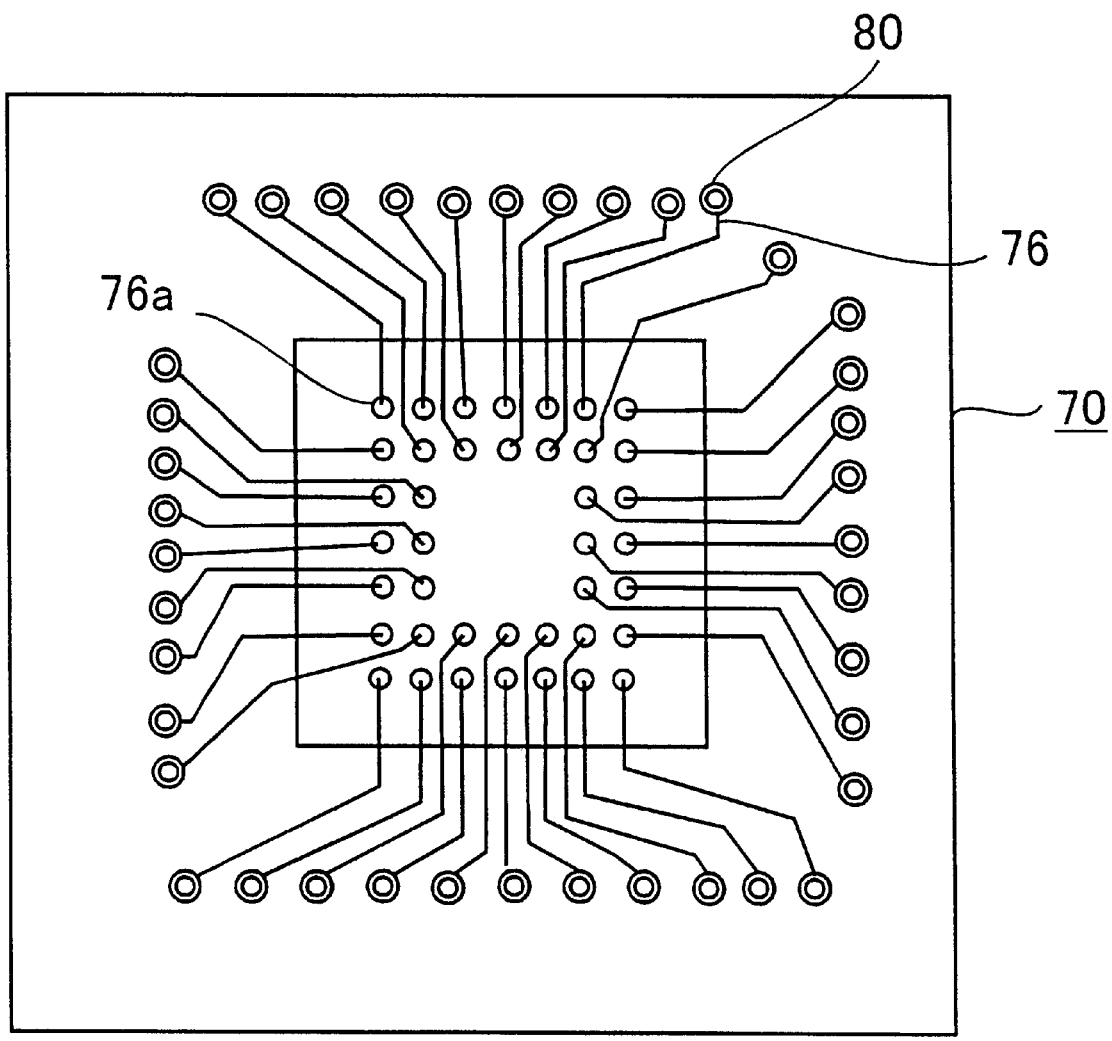
FIG. 18 is a plan view showing a substrate used in the BGA package, shown in FIG. 17.
Figure 19:
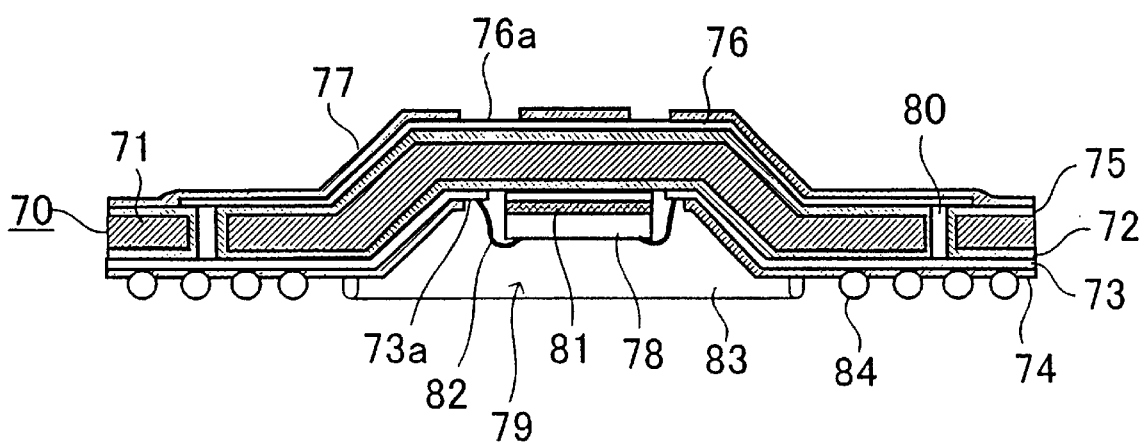
FIG. 19 is a cross-sectional view showing the substrate used in the BGA package, shown in FIG. 17.

FIG. 17 shows a BGA package according to a fifth preferred embodiment of the present invention. FIGS. 18 and 19 show a substrate (70) used for fabricating the BGA package, shown in FIG. 17. In FIGS. 17 to 19, the same or corresponding elements are represented by the same reference numerals. The BGA package includes a substrate 70. which includes a copper plate 71. The copper plate 41 is provided on a front surface with an insulating layer 72 of polyimide having a thickness of 10 to 30 $\mu$m. A copper wiring pattern 73 is formed on the insulating layer 72. A solder resist 74 is formed (spread) over the copper wiring pattern 73 except some areas thereon.

The copper plate 71 is provided on a rear surface with another insulating layer 75 of polyimide having a thickness of 10 to 30 $\mu$m me as shown in FIG. 19. Another copper wiring pattern 76 is formed on the insulating layer 75 to have a thickness of 12 to 35 $\mu$m. Another solder resist 77 is formed (spread) over the copper wiring pattern 76 except some areas thereon. The substrate 70 includes the copper plate 71, insulating layers 72 and 75, and copper wiring patterns 73 and 76.

A metal mold reduction (drawing) process is carried out to the substrate 70 to form a cavity 79 at the front surface in which a semiconductor chip 78 is placed. The copper plate 71 is provided therein with through holes 80, which connect the front surface and rear surface thereof. One ends of the copper wiring pattern 73 form bonding posts 73a, which are to be connected to bonding wires 82. One ends of the copper wiring pattern 76 form lands 76a, which are to be connected to solder balls 85. The lands 76a are coated with thermally stable OSP (Organic Solder Preservative).

The other ends of the copper wiring pattern 76 are connected to the through holes 80. In the cavity 79, an insulating paste 81 is formed (spread) over so that the semiconductor chip 78 is well fixed at the rear surface in the cavity 79. The semiconductor chip 78 is provided at the rear surface with no electrodes. The semiconductor chip 78 is connected at the electrodes to the copper wiring pattern 73 by the bonding wires 82. The cavity 79 is to be filled up with an epoxy resin 83. The substrate 70 is provided at the front surface with solder balls 84. which are arranged in lattice manner. The solder balls 84 are arranged at exposed regions of the solder resist 77. Each of the through holes 80 is connected to the solder balls 84.

The BGA package further includes a semiconductor device 86, which is mounted on the rear surface of the substrate 70. The semiconductor device 86 may be of a chip-size-package type, in which only solder balls 85 are exposed from an electrode surface thereof. The semiconductor device 86 is connected at terminals via the solder balls 85 to the lands 76a of the copper wiring pattern 76.

In fabrication, a heat-reflow process is applied to the solder balls 85 of the semiconductor device 86 so that the terminals thereof are connected to the lands 76a. After that, the solder balls 84 are formed on the front surface of the substrate 70, so that the solder balls 84 can be prevented from being changed in shape.

According to the fifth preferred embodiment of the present invention, as well as the first to fourth preferred embodiments, the excess terminals, which are the solder balls 84 not connected to the semiconductor chip 78, can be used as terminals to be connected to the other semiconductor device 86. In addition, the semiconductor chips 78 and 86 are mounted on the both surface of the substrate 70, so that only a small area is needed to mount two semiconductor chips on the motherboard. It means that the motherboard can be designed smaller in size.

Further, the semiconductor device 86 is a package type, which has been sealed when mounted on the substrate 70, so that no resin (57) is used. Therefore, the BGA packaged can be fabricated with a lower cost.

The present invention is not limited by the above described embodiments, but a variety of modifications or changes may be applied. For example, although the semiconductor chips 28 and 48 are first mounted on the substrates 20 and 40, the other semiconductor chips 36 and 56 can be mounted first.

What is claimed is:

1. A method for fabricating a ball grid array (BGA) package, comprising the steps of:

providing a substrate base, which has first and second surfaces thereof:

forming first and second insulating layers on the first and second surfaces of the substrate base, respectively;

forming through holes in the substrate base;

forming first and second conductive patterns on the first and second insulating layers. respectively, wherein the substrate base, first and second insulating layers and first and second conductive patterns form a substrate;

forming a hole in the substrate so that the hole passes through the substrate;

mounting a second semiconductor chip on the second surface of the substrate over the hole;

injecting a resin into a space between the second semiconductor chip and substrate through the hole;

hardening the resin with heat to seal the second semiconductor chip therein; mounting a first semiconductor chip on the first surface of the substrate;

providing solder balls on the first surface of the substrate so that the first semiconductor chip is electrically connected through the first conductive pattern to the solder balls and the second semiconductor chip is electrically connected through the second conductive pattern and through holes to the solder balls.

2. A semiconductor device, comprising:

a pressed metal substrate having a first surface and a second surface opposing the first surface, wherein a cavity is formed in the first surface and a projecting portion corresponding to the cavity is formed on the second surface;

first and second insulating layers formed on the first surface and second surface, respectively;

first conductive patterns and second conductive patterns formed on the first and second insulating layers, respectively;

a first semiconductor chip mounted in the cavity and being electrically connected to the first conductive patterns;

a second semiconductor chip mounted on the projecting portion and being electrically connected to the second conductive patterns; and a plurality of solder balls which are electrically connected to the first and second conductive patterns.

3. A semiconductor device according to claim 2, further comprising:

a plurality of through holes formed in the metal substrate, wherein the second conductive patterns are electrically connected to the solder balls via the through holes.

4. A semiconductor device according to claim 2, wherein said plurality of solder balls that are electrically connected to the first and second conductive patterns are formed on a common surface of the semiconductor device.

5. A method of making a semiconductor device, comprising:

providing a pressed metal substrate having a first surface and a second surface opposing the first surface;

forming a cavity in the first surface and forming a projecting portion corresponding to the cavity on the second surface;

forming first and second insulating layers on the first surface and the second surface, respectively;

forming first conductive patterns and second conductive patterns on the first and second insulating layers, respectively;

mounting a first semiconductor chip in the cavity, the first semiconductor chip being electrically connected to the first conductive patterns;

mounting a second semiconductor chip on the projecting portion, the second semiconductor chip being electrically connected to the second conductive patterns; and electrically connecting a plurality of solder balls to the first and second conductive patterns.

6. The method recited in claim 5, further comprising forming a plurality of through holes in the metal substrate, the second conductive patterns being electrically connected to the solder balls via the through holes.

7. The method recited in claim 6, further comprising spreading an insulating paste on the projecting portion prior to mounting the second semiconductor chip, and using the insulating paste to fix the second semiconductor chip to the projecting portion.

8. The method recited in claim 6, further comprising providing a surface of the second semiconductor chip with conductive bumps; using the conductive bumps to space the second semiconductor chip from the projecting portion, and further using the conductive bumps to electrically connect the second semiconductor chip to the second conductive patterns; and filling a space between the second semiconductor chip and the projecting portion with a resin.

9. The method recited in claim 8, wherein said filling includes sidewardly injecting the resin into the space.

10. The method recited in claim 8, wherein said filling seals the second semiconductor chip.

11. The method recited in claim 8, further comprising forming a hole extending entirely through the substrate from the first surface to the second surface; wherein said mounting a second semiconductor chip includes positioning the second semiconductor chip over a first opening of the hole; and wherein said filling includes injecting the resin into a second opening of the hole to fill the space.

12. The method recited in claim 8, wherein said filling includes placing a tapeshaped resin between the second semiconductor chip and the projecting portion; and heating the resin to set the resin and seal the second semiconductor chip to the projecting portion.

13. The method recited in claim 12, wherein said heating simultaneously causes the conductive bumps to be electrically connected to the second conductive patterns.

14. The method recited in claim 6, further comprising providing a surface of the second semiconductor chip with conductive bumps; and performing a heat reflow process to the conductive bumps to cause the second semiconductor chip to be electrically connected to the second conductive patterns.

15. The method recited in claim 14, wherein said electrically connecting a plurality of solder balls is performed after said heat reflow process is performed.

16. The method recited in claim 14, wherein the second semiconductor chip is of a chip size package type.

17. The method recited in claim 16, wherein an entire transition between the second semiconductor chip and the projecting portion is free of resin after said mounting a second semiconductor chip on the projecting portion is performed.

* * * * *